United States Patent
Kruit

(10) Patent No.: US 7,348,567 B1
(45) Date of Patent: *Mar. 25, 2008

(54) APPARATUS FOR GENERATING A PLURALITY OF BEAMLETS

(75) Inventor: Pieter Kruit, Delft (NL)

(73) Assignee: Mapper Lithography IP B.V., CJ Delft (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/545,975

(22) Filed: Oct. 10, 2006

Related U.S. Application Data

(62) Division of application No. 10/797,364, filed on Mar. 10, 2004, now Pat. No. 7,129,502.

(60) Provisional application No. 60/453,745, filed on Mar. 10, 2003.

(51) Int. Cl.
*H01J 37/04* (2006.01)

(52) U.S. Cl. ............... 250/396 R; 250/398; 250/492.2

(58) Field of Classification Search .............. None
See application file for complete search history.

(56) References Cited

U.S. PATENT DOCUMENTS

| | | | |
|---|---|---|---|
| 4,243,866 A | 1/1981 | Pfeiffer et al. | |
| 4,524,278 A | 6/1985 | Le Poole | 250/398 |
| 4,543,512 A | 9/1985 | Nakasuji et al. | |
| 4,544,847 A | 10/1985 | Taylor et al. | |
| 4,996,441 A | 2/1991 | Lischke | |
| 5,483,074 A | 1/1996 | True | |
| 6,014,200 A | 1/2000 | Sogard et al. | |
| 6,124,599 A | 9/2000 | Muraki | |
| 7,129,502 B2 * | 10/2006 | Kruit | 250/396 R |
| 2002/0039829 A1 | 4/2002 | Yasuda et al. | |

OTHER PUBLICATIONS

Roclofs B J GM et al., "Feasibility of Multi-Beam Electron Lithography", Microelectric engineering, Elsevier Publishers BV, Amsterdam, NL, vol. 2, No. 4, Dec. 1984, pp. 259-279.
Ando M et al., "Experimental Study of Multiple Ion Beam Machine", Microelectronic Engineering, Elsevier Publishers BV, Amsterdam, NL, vol. 11, No. 1, pp. 431-434.

* cited by examiner

*Primary Examiner*—Jack I. Berman
(74) *Attorney, Agent, or Firm*—Blakely, Sokoloff, Taylor & Zafman

(57) ABSTRACT

The invention relates to an apparatus for generating a plurality of charged particle beamlets, comprising a charged particle source for generating a diverging charged particle beam, a converging means for refracting said diverging charged particle beam and a lens array comprising a plurality of lenses, wherein said lens array is located between said charged particle source and said converging means.

In this way, it is possible to reduce aberrations of the converging means.

22 Claims, 7 Drawing Sheets

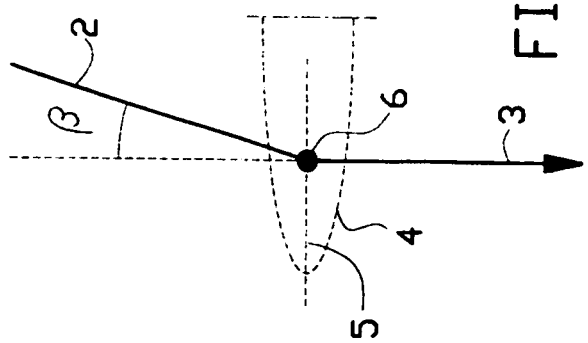
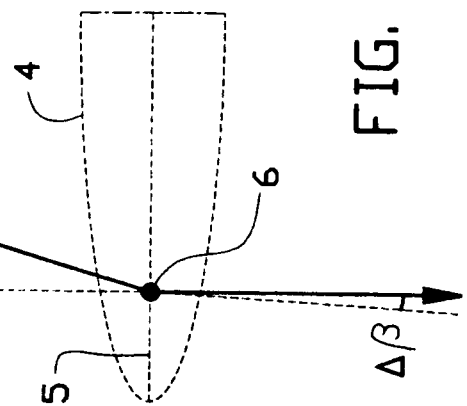
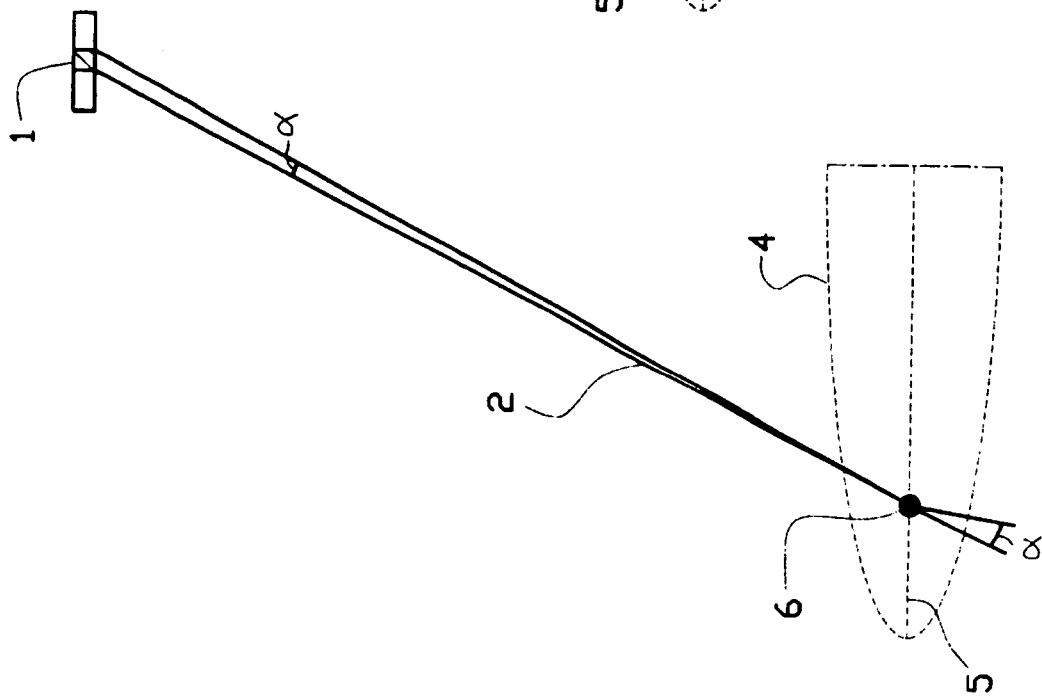
FIG. 2
FIG. 3B
FIG. 3A

APPARATUS FOR GENERATING A PLURALITY OF BEAMLETS

The present patent application is a Divisional of application Ser. No. 10/797,364, filed Mar. 10, 2004 now U.S. Pat. No. 7,129,502, which claims the benefit of U.S. Provisional Application No. 60/453,745, filed Mar. 10, 2003 and International Application No. PCT/NL2004/0070174.

BACKGROUND

The present invention relates to an apparatus for generating a plurality of charged particle beamlets. Charged particle beams are used in a variety of systems, like lithography and microscopy systems. Some of these systems use a single source generating one beam which is subsequently split into a plurality of beamlets. The charged particle source used in these systems emits a charged particle beam with a defined opening angle, i.e. a diverging beam. The diverging beam often needs to be collimated, i.e. transformed into a parallel beam. In most applications a lens or lens assembly is used to refract the diverging beam emitted.

However, the change of angle of a charged particle beamlet is not exactly defined due to so-called chromatic aberrations. As a result the spot size of the beamlets on the target to be exposed or imaged also increases.

In GB2340991 and in U.S. Pat. No. 5,834,783, U.S. Pat. No. 5,905,267, U.S. Pat. No. 5,981,954, U.S. Pat. No. 6,124,599, U.S. Pat. No. 6,137,113, U.S. Pat. No. 6,166,387, U.S. Pat. No. 6,274,877, and the Journal of Vacuum Science and Technology B18 (6) pp. 3061-3066, charged particle beam lithography systems are disclosed, comprising a lens assembly for refraction of a diverging beam into a parallel beam. After refraction, the beam is split up into a plurality of beamlets using an aperture array. In these lithography systems an image of the apertures is projected on the surface to be exposed. To decrease the spot size, the image is reduced by a factor 200. The aberrations are dominated by the aberrations of the last lens in the system and not by the aberrations of the collimation assembly. However, these aberrations will affect the performance of the system.

The lens assembly in such systems has a chromatic aberration $\Delta\beta=C\cdot\Delta E/E\cdot\beta$, wherein $\beta$ is the angle of an incoming ray with respect to the normal of the lens assembly and E the energy of the incoming charged particles. If $\Delta\beta$ is comparable to the intrinsic angle in the beam, it contributes to the size of the spots, which are formed on an object, e.g. a wafer with resist, to be processed.

SUMMARY OF THE INVENTION

An objective of the current invention is to improve the apparatus for generating a plurality of beamlets for producing better-defined beamlets.

A further objective of the present invention is to reduce blur of beamlets in an apparatus for generating a plurality of beamlets.

A further objective of the present invention is to reduce the aberrations induced by a collimator lens or lens assembly in an apparatus for generating a plurality of beamlets to a negligible value.

The invention therefore provides an apparatus for generating a plurality of charged particle beamlets, comprising:
 a charged particle source for generating a diverging charged particle beam;
 a converging means for refracting said diverging charged particle beam;
 a lens array comprising a plurality of lenses, wherein said lens array is located between said charged particle source and said converging means.

As a result of the position of the lens array, each beamlet is better defined. When the apparatus of the present invention is for instance used in a multi-beam lithography system, the system can transfer a pattern onto a substrate with higher beam current and resolution. The apparatus will allow a microscopy system to produce an image of an object with an enhanced resolution.

In an embodiment the lenses are electrostatic lenses, in fact lenslets, for converging a charged particle beamlet.

Each beamlet can result from a beam splitter array positioned before the array of converging elements, which splits the beam of charged particles from a source up in a plurality of beamlets. It can also be possible to use the array of converging elements to split the beam up into the plurality of beamlets.

In an embodiment of the apparatus of the present invention, the converging means is adapted for refracting a diverging charged particle beam into a substantially parallel charged particle beam for generating a plurality of substantially parallel charged particle beamlets. Using parallel beamlets makes the apparatus easier to control. Furthermore, in many applications, especially lithography system, it is desirable to have the beamlets impact the target substantially perpendicular to the target plane.

In an embodiment of the apparatus of the present invention, the charged particle source is arranged in a focal plane of the converging means. In this way, it is made sure that substantially parallel beamlets are generated.

In an embodiment of the apparatus described above, the lens array is arranged to project images of said source in the principal plane of the converging means. This further reduces blur and makes it possible to use the apparatus in high-resolution applications.

In most applications, the converging means will thus be a collimator, i.e. a lens or lens system or assembly, which refracts a diverging beam into a substantially parallel, or even converging, beam. Usually, this means will comprise electrostatic lenses.

In an embodiment of the apparatus, it is furthermore provided with splitting means for splitting said charged particle beam in a plurality of charged particle beamlets. In this way, it was found possible to reduce the heat load of the lens array. Furthermore, better defined and separated beamlets resulted. In an embodiment thereof, the splitting means comprises a spatial filter. In a specific embodiment, the splitting means comprises an aperture array. This allows a simple and robust apparatus. In a further embodiment of the apparatus with splitting means, the splitting means is located between said charged particle source and said lens array to split up said diverging charged particle beam into a plurality of charged particle beamlets. This provides the possibility of obtaining well-defined beamlets and reduces the heat-load of the lens array, thereby improving its performance.

In an embodiment of the apparatus with spatial filter, the spatial filter is concave with respect to said source. In a preferred embodiment thereof, the curvature of said spatial filter has its focal point substantially in the origin of the charged particle beam. In this way, it has proven possible to even further reduce blur and obtain better-defined beamlets.

In an embodiment, the lens array is concave with respect to said source. In a further embodiment thereof, the curvature of said lens array has its focal point substantially in the origin of the charged particle beam. This makes it possible to let all the beamlets pass through the center of a lens, thus reducing distortion of the beamlets even further by avoiding additional aberrations caused by said lens array.

In an embodiment of the apparatus with splitting means, the splitting means is aligned with said lens array for providing each lens with an individual beamlet. In this way, each lens in the lens array receives one beamlet created by the splitting means.

In an embodiment of the apparatus said lens array is an array of electrostatic lenses. In a further embodiment thereof, the charged particle beam is an electron beam. In another embodiment the charged particle beam is an ion beam.

In an embodiment of the apparatus, said lens array comprises an aperture plate, and means for defining a equipotential surface substantially parallel to the aperture plate at a distance from the aperture plate. Preferably at a different potential then the aperture plate itself.

In an embodiment of the apparatus, the aperture plate has a electrically conducting surface and means for defining the electrostatic potential of said surface. In this case, the resulting equipotential surfaces will be shaped as shown in the detail of FIG. 6. One embodiment is a (metal or metal-covered) plate with through holes at the locations of beamlets.

In an embodiment of the apparatus, said means for defining an equipotential surface comprises a plate having a through hole at the location of the beam of beamlets, in particular a round hole with its center at the optical axis of the charged particle beam. A simple embodiment is a (metal or other conducting metal or material covered with a conducting layer) plate with a round hole.

In an embodiment of the apparatus, said means for defining an equipotential surface substantially parallel to the aperture plate at a distance from the aperture plate are located between said source and said array of converging elements.

In an embodiment of the apparatus, said means for defining an equipotential surface substantially parallel to the aperture plate at a distance from the aperture plate are located between said array of converging elements and said converging means.

In an embodiment of the apparatus, said converging means comprises at least one deflector array with deflectors aligned with the beamlets. Such a deflector can for instance be a plate with holes, provided with (two) opposite electrodes at the side of the holes or in the holes. A detail is shown in FIG. 7.

In an embodiment of the apparatus, said converging means further comprises a controller for applying different voltages to the different deflectors of said deflector array.

In an embodiment of the apparatus, said controller is adapted for applying voltages to each deflector of said deflector array for deflecting a beamlet, with the controller adapted for setting the voltages to have each deflector assert a deflecting effect proportional to the distance of a deflector with respect the optical axis of the beam. When the deflecting effect of each deflector is proportional to its distance from the optical axis of the beam, the net effect of all the deflectors together can be deflecting the diverging beamlets in such a way that their optical axes are almost parallel.

In an embodiment of the apparatus, said controller is adapted for applying voltages to each deflector of said deflector array for deflecting a beamlet, with the controller adapted for setting the voltages to have each deflector assert a deflecting effect sufficient for compensating aberrations of further converging devices of the converging means. In this embodiment, the converging means comprise an electrostatic lens acting as (main) collimator. These lenses usually have spherical aberrations. When these aberrations are measured and thus exactly defined, the voltage of each deflector in the array can be set to compensate the local effect of the collimator.

In an embodiment of the apparatus, said converging means is an electrostatic lens. In an embodiment of this apparatus, said lens array comprises an end plate providing a first electrode in said electrostatic lens. In an embodiment of this apparatus, it is further provided with a second controller for applying a voltage to the electrodes of said electrostatic lens for operating said electrostatic lens substantially free of spherical aberration.

In an embodiment of the apparatus, said array of converging elements comprises means for defining a substantially planar equipotential surface at the location of said array. In an embodiment, one of the surfaces of the array provided with conducting (metal) layer and a voltage is applied to it. There will then remain only the local differences in the equipotential surfaces depicted in FIG. 6, which have only a focussing effect on the beamlets.

In an embodiment of the apparatus, the apparatus further comprises a first means for defining an equipotential surface between said array and said converging means.

In an embodiment of the apparatus, said first means comprises a plate provided with a hole having a circumferential edge surrounding the beam or beamlets.

In an embodiment of the apparatus, said plate comprises a round hole having its center aligned with the optical axis of the beam. In an embodiment, a metal plate with one through hole is provided, attached to a voltage source providing a (time) constant voltage.

In an embodiment of the apparatus, the apparatus is further provided with means from applying an electrostatic potential to said plate.

In an embodiment of the apparatus, the apparatus further comprising a second means for defining an equipotential surface after said converging means and said.

In an embodiment of the apparatus, said second means comprises a plate provided with a hole having a circumferential edge surrounding the beamlets.

In an embodiment of the apparatus, said plate comprises a round hole having its center aligned with the optical axis of the beam. Again, this can be a (metal) plate with a through hole.

In an embodiment of the apparatus, the apparatus further provided with means from applying an electrostatic potential to said plate.

The invention further pertains to a method of operating the various voltages described and in the attached drawings above in order to obtain the effects disclosed.

The invention further pertains to a charged particle beam lithography system comprising the apparatus of the invention described above. The apparatus is of the invention is capable of producing a very high number of well-defined beamlets, making it possible to realize a lithography system having a high resolution, even smaller than 100 nm. A resolution of below 20 nm seems possible. This high resolution can be combined with a high throughput (wafers/hour).

The invention furthermore relates to a substrate processed with this charged particle beam lithography system.

The invention furthermore pertains to a charged particle beam microscopy system comprising the apparatus of the present invention described above.

DRAWINGS

The invention will be further elucidated in the following embodiments of a maskless lithography system according to the current invention, in which.

Figure 1B:
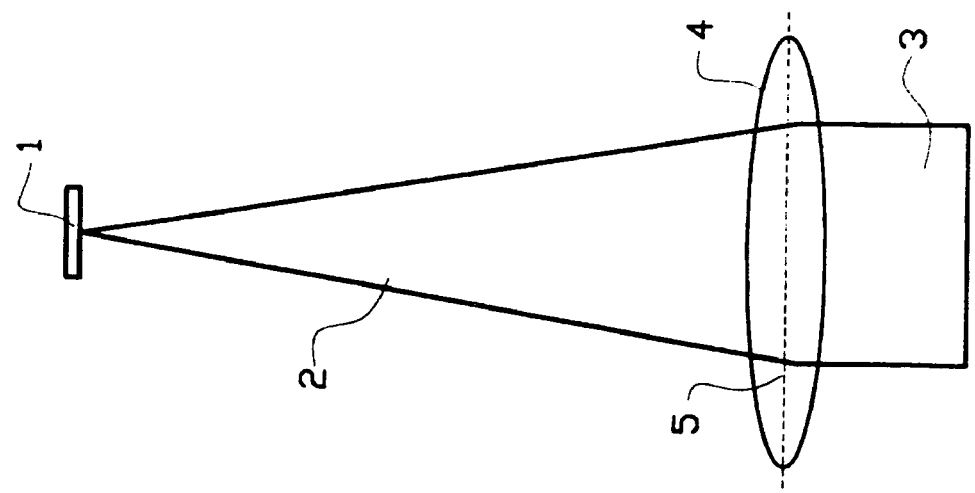
FIG. 1B shows the source of FIG. 1B with a collimator positions in the beam.
Figure 5:
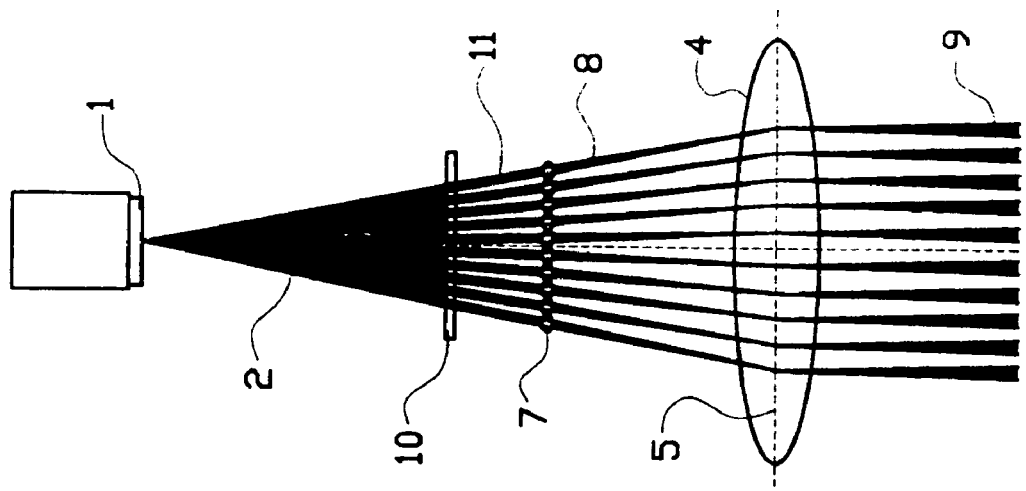
Figure 4:
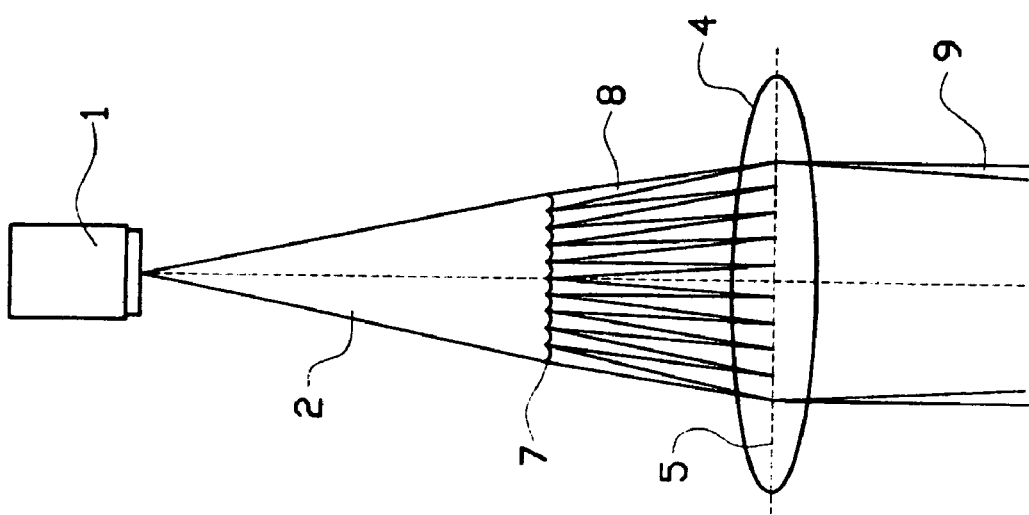
Figure 6:
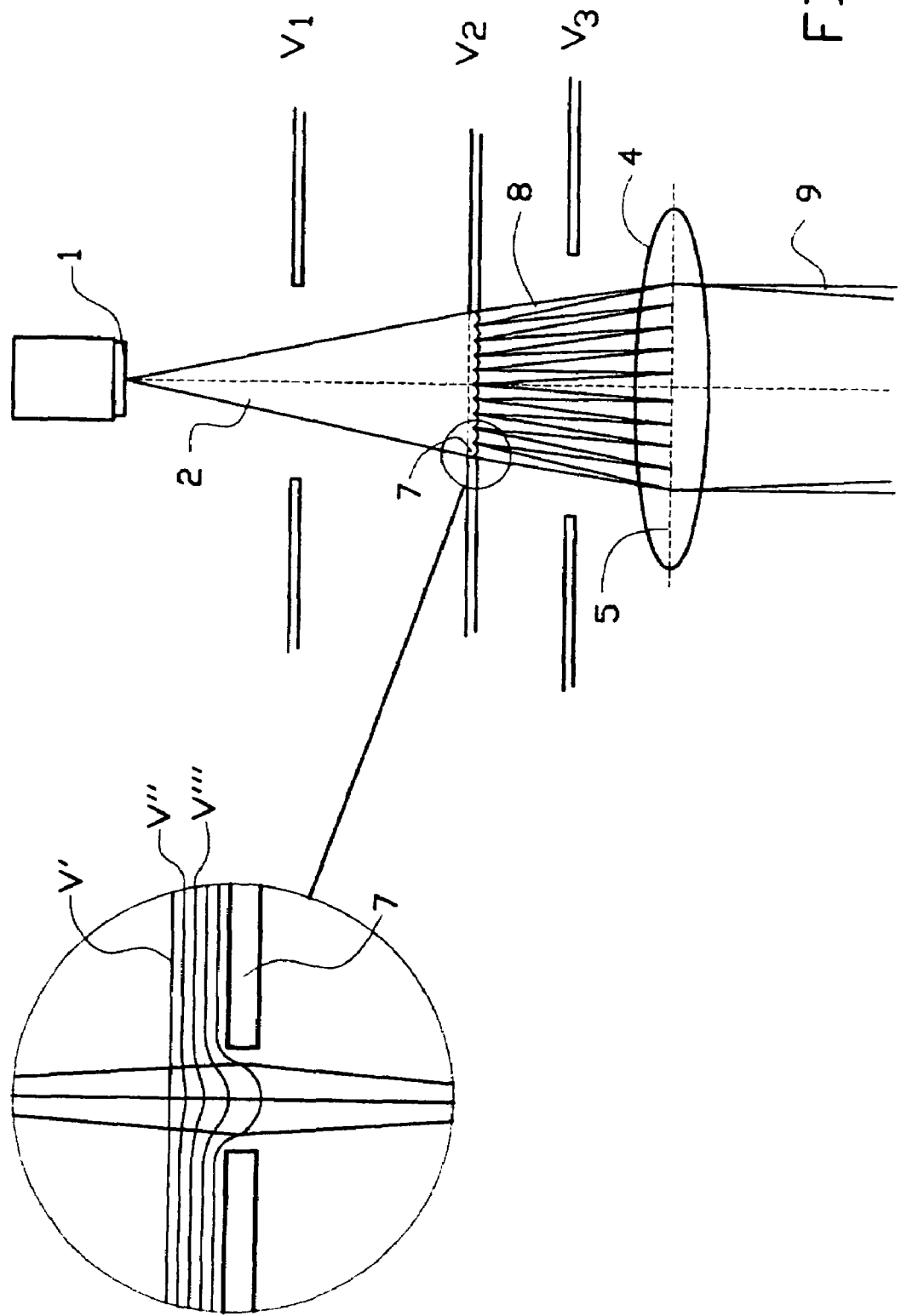
Figure 7:
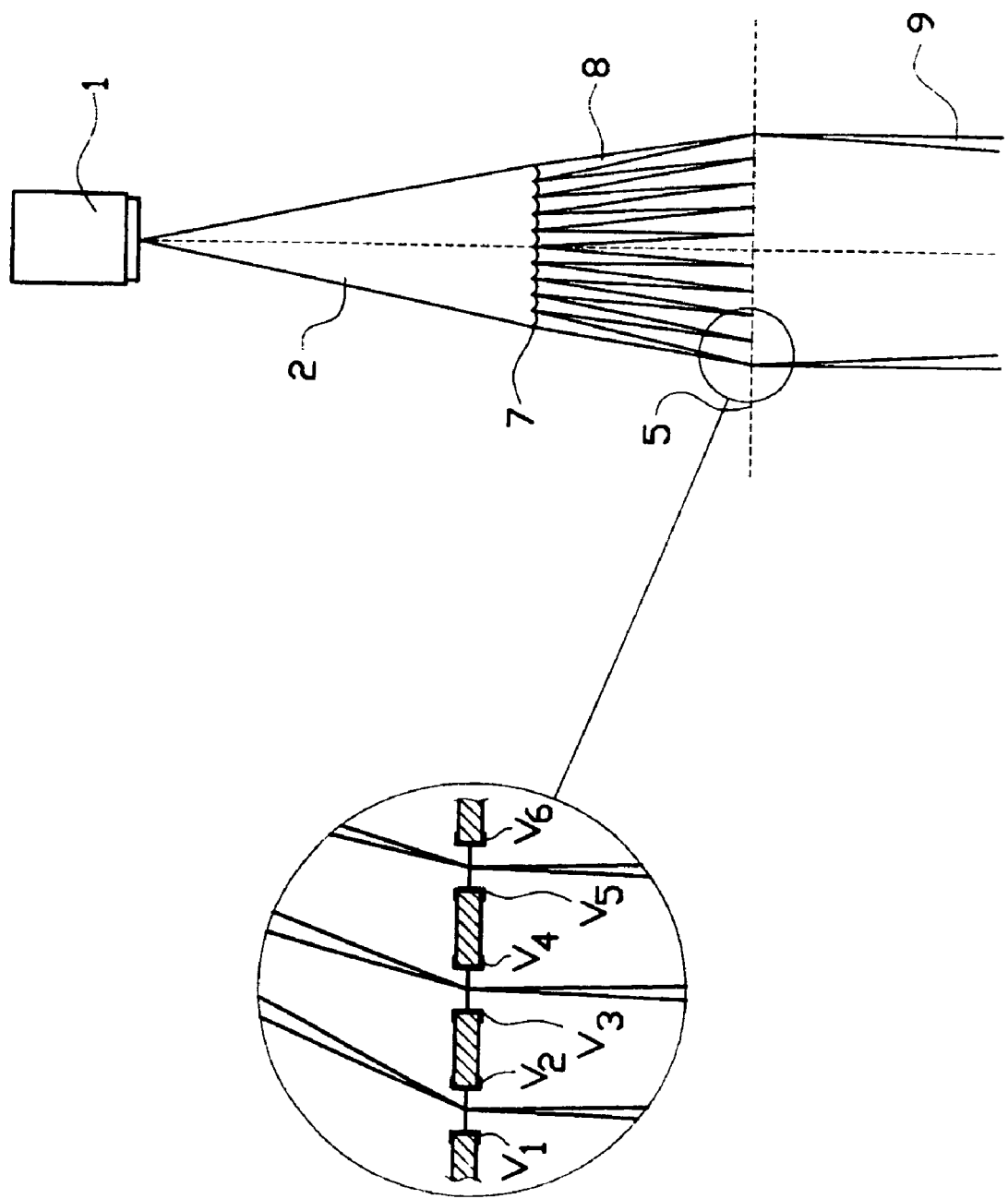
Figure 9:
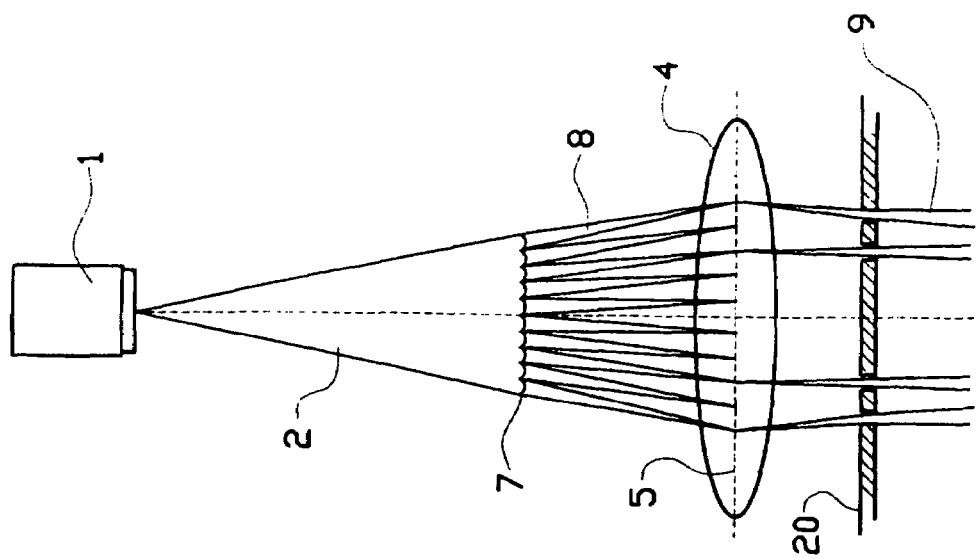
Figure 8:
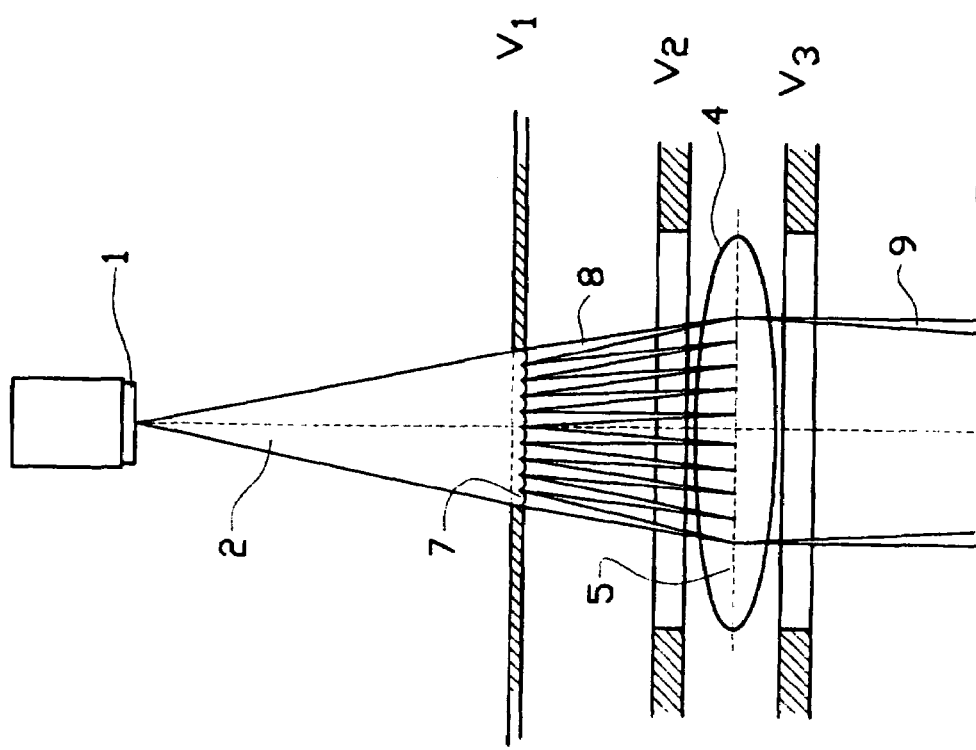
Figure 10A:
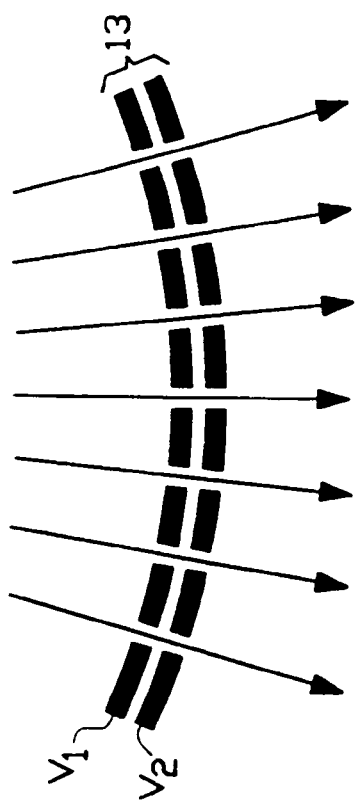
Figure 10B:
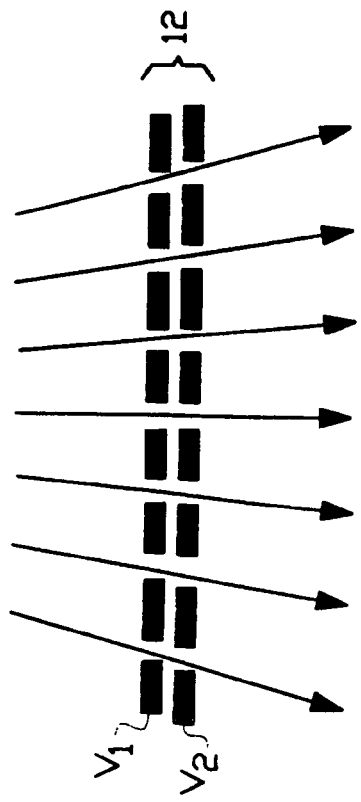

FIG. 2 shows the trajectory of a small portion of a charged particle beam of FIG. 1B, FIG. 3A shows the effect of the size of the source, resulting in an intrinsic opening angle α of the beam, FIG. 3B shows the uncertainty Δβ resulting from charged particles passing one collimation point, FIG. 4 shows the positioning of the lens array according to the present invention, FIG. 5 shows the apparatus of FIG. 4 with aperture array, FIG. 6 shows the apparatus of FIG. 4, with electrostatic lenses effect of equipotential surfaces, FIG. 7 uses a deflector array as collimator lens, FIG. 8 uses equipotential plane for collimating, FIG. 9 combines a deflector array with a collimator lens, FIGS. 10A, 10B show the effect of a curved lens array.

DETAILED DESCRIPTION OF THE INVENTION

Figure 1A:
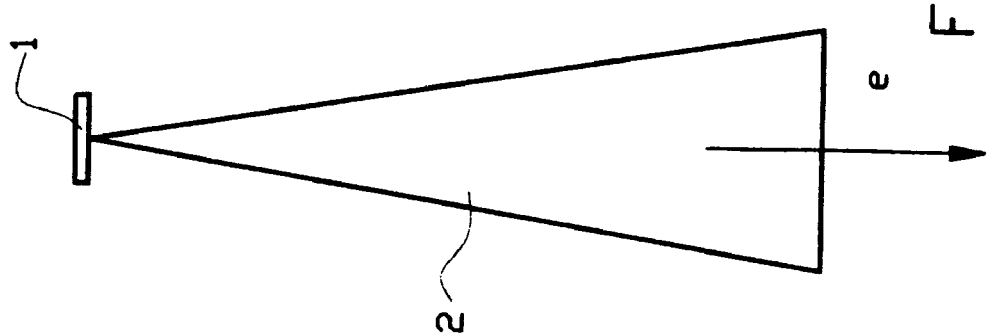
FIG. 1A shows an arbitrary source emitting a diverging beam.

FIG. 1A shows an arbitrary source 1 that emits a diverging charged particle beam 2. In a variety of systems not a diverging beam 2, but a collimated beam 3, i.e. a beam, which is substantially parallel, is desired. Therefore a collimator lens 4 as shown (schematically) in FIG. 1B or collimation assembly is positioned in the beam trajectory to collimate the diverging charged particle beam 2. The collimation takes place in the collimation plane or principal plane 5 of the collimator 4, denoted in FIG. 1B by the dotted line. After collimation the (almost) parallel charged particle beam can be split in a plurality of beamlets, which are subsequently focused on a target for pattern exposure, inspection, observation or other purposes.

In the collimation plane or principal plane 5, an incoming charged particle beam is refracted to create a collimated beam. FIG. 2 shows the trajectory of a small portion of the diverging charged particle beam 2' which is refracted in the collimator plane at collimation point 6. The angle between the initial direction and the final direction is denoted by β. In an ideal situation all emitted charged particles seem to originate from a singularity on the emission surface of the source 1.

However, in reality the charged particle path of a charged particle emitted from said source 1 is not as well defined as shown in FIG. 2. In fact the source size, seen from said collimation point 6 looking upward to the source, is not a singularity. It has a finite size as shown in FIG. 3A. The finite size induces a finite angle α, called the intrinsic opening angle of the charged particle beam. Moreover, due to an intrinsic energy spread within the charged particle beam, the diffraction angle of each charged particle in the collimation plane 5 is not as well-defined as shown in FIG. 2. The energy spread of the charged particles emitted by the source results in chromatic aberrations at the collimation point, resulting in a dispersion Δβ in the deflection angle at the collimation point 6. This is shown in FIG. 3B, which shows a detail around point 6 of FIG. 3A.

The aberrations will become a problem when the beam is for instance projected on a target for exposure in lithography systems or for observation in microscopy systems in which applications a very small spot size is desired. Due to the aberrations the beamlet will get blurred and the spot size of the beamlet is no longer well-defined, which results in a blurry pattern or image. This is especially the case when angle Δβ comes in the order of the intrinsic opening angle α of the charged particle beam. The source size or source image size scale with $(\alpha+\Delta\beta)*l$, wherein l is the distance between the collimation plane 5 and the source 1. The influence of aberration Δβ on the focused spot size of the emitted charged particle beam scales with $\Delta\beta*l$. Now if Δβ is of the same order as or larger than the intrinsic opening angle α, a significant reduction of resolution results.

The apparatus of the present invention provides a solution to overcome the negative influences of the chromatic aberrations. The influence of these aberrations is avoided by positioning a lens array 7 having a plurality of lenses between said source 1 and said collimator lens 4 as is depicted in FIG. 4. In fact, said lens array 7 is positioned in such a way that each lens of the lens array projects an image of said source on said collimation plane 5.

Consequently, the internal opening angle in the beam is determined by the size of the beamlet in the lens array, d, and the distance between said lens array and the collimation plane, f, as d/f. Thus, by choosing d and f, the intrinsic angle α can be made substantially larger than the aberration Δβ, and the blur in the system will therefore not increase. Thus the invention as described above provides the generation of a plurality of substantially parallel beamlets 9 by splitting and collimating a diverging charged particle beam 2.

The invention can be further improved by adding additional splitting means into the system, preferably located between the source 1 and the lens array 7. The splitting means split the diverging charged particle beam 2 in a plurality of diverging charged particle beamlets 11. In most embodiments the splitting means comprise a spatial filter, preferably an aperture array 10 as is depicted in FIG. 5. Adding an aperture array 10 at this position into the system provides a way to reduce the heat load on the lens array 7. It furthermore enhances the performance of the lens array 7 located behind (when following the optical pathway of the charged particle beamlets) said splitting means.

The invention can be improved further by adding opening angle limiting means, preferably an aperture array, in the optical pathway of said plurality of charged particle beamlets behind said collimator lens 4 or collimator lens assembly. The opening angle limiting means are arranged to limit the opening angle of the beamlets that have passed the collimation plane and corrects for additional third order aberrations induced by said collimation lens 4.

For the lens array, any array of conventional charged particle lenses can be used. It is also possible, however, to use the embodiment shown in FIG. 6. In FIG. 6, three plates are installed, each at its own potential V1, V2 and V3. In fact, only the plane at V1 or at V3, together with the aperture plate 7 at V2, are actually needed in order to have a lens effect. The plates at V1 and V3 have a hole large enough to let the beam 2 pass without interfering with the beam 2.

Plate 7 is in fact the actual lens array. Plate 7 here is a plate with holes at the location where beamlets 8 should be created. In FIG. 6 an enlarged detail of one of the holes in plate 7 is shown. In this enlarged view, the equipotential surfaces (indicated V', V'', V''') are added, as well as the trajectory of two charged particles. Due to the shape of the equipotential surfaces, there will be a focussing effect on the charged particle beamlets resulting from plate 7.

In another embodiment, which may even be combined with the above shown embodiments, shown in FIG. 7, instead of a conventional charged particle collimating lens 4, a deflector array is used for collimating. In FIG. 7, an enlarged detail of an embodiment of such a deflector array is shown. This deflector has holes at the location of the beamlets 8, and electrodes at voltages V1-V6 (for the three deflectors shown). When the voltages V1-V6 are carefully chosen, a deflection can be set in such a way that the deflection is equivalent to the distance of the optical axis of charged particle beam 2. In such a way, it is possible to design an almost ideal collimator lens for this type of multi-beamlet systems.

It is even possible to design a multi-beamlet system which has virtually no spherical aberration. A layout for such a system is shown in FIG. 8. In this layout, lens array 7 is put on a Voltage V1. Macroscopically on the scale shown in FIG. 8, the lens array 7 can be treated as an equipotential surface which is a plane. Furthermore, two plates are added, one at a voltage V2 and the other at a voltage V3. These plates have a (through) hole at the location of the beamlets, in order not to interfere with the beamlets 8. When the dimensions of the plates and the voltages V1, V2 and V3 are chosen in the right way, it is now possible to create a collimator lens free of spherical aberration. It is known in the field that such an aberration free lens can, according to Scherzers theorem, only be created if one electrode of the lens is inside the beam. In this particular apparatus, the inventors found out that is was possible to used the aperture plate as an electrode which is inside the beam. As a surprise, it seemed possible to use this type of layout for any multi beamlet system which uses charged particles. It can even be used for x-ray sources. Note that in FIG. 8, collimator lens 4 is only shown as a replacement schedule for the plates.

The embodiments shown in FIGS. 4 and 7 can be combined in a way shown in FIG. 9, in which way it leads to additional advantages. In this layout, the collimator lens 4 has a collimating effect with some spherical aberration, depicted as an over collimation of the outside bealets in FIG. 9. Behind the collimator lens 4, a deflector array is now located. This deflector array has its deflectors aligned with the beamlets 9. When the voltages of the deflectors are properly set, is possible to correct the spherical aberration of the collimator lens 4 using only relatively low voltages. In order to compensate for the spherical aberration of the collimator lens 4, the voltage of each deflector should be set in such a way that its deflecting effect on the charged particle beamlet passing the deflector is proportional to the distance of the deflector from the optical axis of the collimator lens 4 to the third power.

The lens array 7 used in the present invention is preferably an electrostatic lens array 12. FIG. 10A schematically shows an example of such a lens array 12. In an embodiment, the lens array 12 comprises two conducting plates with holes, positioned in close proximity to each other wherein said holes in each plate are substantially aligned with each other. An electric field is applied between the two plates by applying a voltage difference $V_1-V_2$ between said plates as shown in FIG. 10A.

Focusing a diverging charged particle beam may induce a further problem. Each beam passing through a planar electrostatic lens array 12 is not focused correctly due to the fact that the incoming beamlets are not passing the lenses perpendicular to the lens plane (i.e., parallel to the lens axis). This complication affects the performance of the system, i.e. additional aberrations are introduced.

It was found that this complication could be avoided by applying a convex lens array 13 with its inner surface facing the source as depicted in FIG. 10B. When the convexity is well-matched with the divergence of the beam, each beamlet passes the lens array 13 through the holes substantially perpendicular to the surface of both plates.

The charged particle beam that is used can be any charged particle beam known in the art, but preferably an electron beam or ion beam. The invention can be used in a lithography system or microscopy system. In a lithography system the invention provides a way to pattern a substrate to be patterned with enhanced resolution, since the spot size of the charged particle beam is kept small. Furthermore in microscopy systems objects can be imaged with higher resolution.

It is to be understood that the above description is included to illustrate the operation of the preferred embodiments and is not meant to limit the scope of the invention. From the above discussion, many variations will be apparent to one skilled in the art that would yet be encompassed by the spit and scope of the present invention.

I claim:

1. An apparatus for generating a plurality of charged particle beamlets, comprising:
   a charged particle source, for a diverging charged particle beam generated by said source;
   a lens array comprising a plurality of lenses;
   splitting means comprising a spatial filter comprising an aperture array, for splitting said charged particle beam in a plurality of charged particle beamlets;
   said splitting means being aligned with said lens array for providing each lens with an individual beamlet.

2. The apparatus of claim 1, wherein the system comprises a converging means for refracting said diverging charged particle beam.

3. The apparatus of claim 2, wherein said lens array is located between said charged particle source and said converging means.

4. The apparatus of claim 1, wherein said spatial filter is located between said charged particle source and said lens array to split up said diverging charged particle beam into a plurality of charged particle beamlets.

5. The apparatus of claim 1, wherein the charged particle beam is an electron beam and said lens array is an array of electrostatic lenses.

6. The apparatus according to claim 1, wherein said lens array comprises an aperture plate.

7. The apparatus of claim 6, further comprising means for defining an equipotential surface at a distance from said aperture plate at a different potential than said aperture plate itself.

8. The apparatus of claim 7, wherein said equipotential lines are defined substantially parallel to said aperture plate.

9. The apparatus of claim 7, wherein the aperture plate has a electrically conducting surface and means for defining the electrostatic potential of said surface.

10. The apparatus of claim 7, wherein said means for defining an equipotential surface comprises a plate having a through hole at the location of the beam of beamlets, in particular a circular hole having its center at the optical axis of the charged particle beam.

11. The apparatus of claim 10, wherein said means for defining an equipotential surface are located between said source and said lens array.

12. The apparatus of claim 10, wherein said means for defining an equipotential surface are located between said array of converging elements and said converging means.

13. The apparatus of claim 2, wherein said converging means comprises at least one deflector array with deflectors aligned with the beamlets.

14. The apparatus of claim 2, wherein said converging means is an electrostatic lens.

15. The apparatus of claim 1, wherein said charged particle beam is an electron beam.

16. The apparatus of claim 1, wherein said charged particle beam is an ion beam.

17. A charged particle beam lithography system comprising the apparatus of claim 1.

18. A substrate processed with the charged particle beam system of claim 1.

19. A charged particle beam microscopy system comprising the apparatus of claim 1.

20. The apparatus according to claim 1, wherein the converging means is adapted for refracting a diverging charged particle beam into a substantially parallel charged particle beam for generating a plurality of substantially parallel charged particle beamlets.

21. The apparatus according to claim 1, wherein said charged particle source is arranged in a focal plane of said converging means.

22. The apparatus according to claim 1, wherein the lens array is arranged to project images of said source in the principal plane of said converging means.

* * * * *